US012563744B2

(12) United States Patent
Yang et al.

(10) Patent No.: US 12,563,744 B2
(45) Date of Patent: Feb. 24, 2026

(54) MEMORY DEVICE AND MEMORY APPARATUS COMPRISING THE SAME

(71) Applicant: Samsung Electronics Co., Ltd., Suwon-si (KR)

(72) Inventors: Kiyeon Yang, Suwon-si (KR); Bonwon Koo, Suwon-si (KR); Hajun Sung, Suwon-si (KR); Changseung Lee, Suwon-si (KR); Minwoo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 428 days.

(21) Appl. No.: 18/164,926

(22) Filed: Feb. 6, 2023

(65) Prior Publication Data

US 2024/0074210 A1     Feb. 29, 2024

(30) Foreign Application Priority Data

Aug. 31, 2022    (KR) ........................ 10-2022-0110326

(51) Int. Cl.
 *H10B 63/00*       (2023.01)
 *H10N 70/00*       (2023.01)
(52) U.S. Cl.
 CPC ............. *H10B 63/24* (2023.02); *H10B 63/84* (2023.02); *H10N 70/841* (2023.02); *H10N 70/8828* (2023.02)
(58) Field of Classification Search
 CPC ....... H10B 63/24; H10B 63/84; H10N 70/841
 See application file for complete search history.

(56) References Cited

U.S. PATENT DOCUMENTS

| | | | |
|---|---|---|---|
| 5,166,758 A | 11/1992 | Ovshinsky et al. | |
| 6,178,100 B1 * | 1/2001 | Kitano | H02M 3/3385 |
| | | | 363/19 |
| 7,864,567 B2 | 1/2011 | Gordon et al. | |
| 8,513,640 B2 | 8/2013 | Morikawa et al. | |
| 9,129,673 B2 | 9/2015 | Tominaga et al. | |
| 9,220,901 B2 * | 12/2015 | Gururaj | A61N 1/36142 |
| 9,305,976 B2 * | 4/2016 | Cho | H10N 70/8833 |

(Continued)

FOREIGN PATENT DOCUMENTS

| | | | | |
|---|---|---|---|---|
| CN | 117156960 A | * | 12/2023 | ........... H10N 70/231 |
| CN | 117641940 A | * | 3/2024 | ............. H10N 70/20 |

(Continued)

OTHER PUBLICATIONS

Extended European Search Report dated Aug. 31, 2023 for corresponding European Application No. 23158280.0.

*Primary Examiner* — Laura M Menz
(74) *Attorney, Agent, or Firm* — HARNESS, DICKEY & PIERCE, P.L.C.

(57) ABSTRACT

Disclosed are a memory device and a memory apparatus including the memory device. The memory device may include a first electrode, a second electrode spaced apart from the first electrode, an intermediate layer between the first electrode and the second electrode, and an interface layer in contact with the intermediate layer. The intermediate layer and the interface layer each may have ovonic threshold switching (OTS) characteristics. A material of the interface layer may have a threshold voltage shift greater than a threshold voltage shift ($\Delta V$th) of the intermediate layer.

20 Claims, 12 Drawing Sheets

(56) References Cited

U.S. PATENT DOCUMENTS

| | | | | |
|---|---|---|---|---|
| 9,384,829 | B2 * | 7/2016 | Furuhashi | H10N 70/235 |
| 9,543,513 | B2 * | 1/2017 | Kim | H10N 70/826 |
| 9,704,921 | B2 * | 7/2017 | Kim | H10N 70/20 |
| 9,716,226 | B2 * | 7/2017 | Gealy | H10N 70/841 |
| 9,748,311 | B2 | 8/2017 | Fantini et al. | |
| 10,163,977 | B1 * | 12/2018 | Fantini | H10N 70/826 |
| 10,186,552 | B2 * | 1/2019 | Choi | G11C 13/0004 |
| 10,510,805 | B2 * | 12/2019 | Chan | H10N 70/231 |
| 10,693,065 | B2 * | 6/2020 | Redaelli | H10N 70/24 |
| 10,903,276 | B2 * | 1/2021 | Chan | H01L 21/76885 |
| 11,804,263 | B2 * | 10/2023 | Ha | H10N 70/8833 |
| 11,818,899 | B2 * | 11/2023 | Yang | H10B 63/84 |
| 12,063,793 | B2 * | 8/2024 | Yang | H10B 61/10 |
| 12,101,942 | B2 * | 9/2024 | Yang | H10B 63/84 |
| 2013/0245723 | A1 * | 9/2013 | Gururaj | A61N 1/36142 607/116 |
| 2015/0123066 | A1 * | 5/2015 | Gealy | H10N 70/841 257/4 |
| 2015/0171321 | A1 * | 6/2015 | Chan | H01L 23/53257 438/669 |
| 2016/0056211 | A1 * | 2/2016 | Cho | H10B 63/20 257/4 |
| 2017/0084835 | A1 * | 3/2017 | Gealy | H10B 63/24 |
| 2017/0229513 | A1 * | 8/2017 | Kamata | H10N 70/8828 |
| 2017/0229516 | A1 * | 8/2017 | Chan | H10B 63/84 |
| 2017/0237000 | A1 * | 8/2017 | Terai | H10N 70/8833 257/4 |
| 2018/0019392 | A1 | 1/2018 | Lee et al. | |
| 2018/0102149 | A1 | 4/2018 | Tortorelli et al. | |
| 2018/0286921 | A1 * | 10/2018 | Redaelli | G11C 13/0004 |
| 2018/0315475 | A1 | 11/2018 | Redaelli et al. | |
| 2018/0337329 | A1 | 11/2018 | Gealy et al. | |
| 2019/0115393 | A1 * | 4/2019 | Cheng | H10N 70/8825 |
| 2019/0148456 | A1 | 5/2019 | Wu et al. | |
| 2019/0189206 | A1 * | 6/2019 | Tortorelli | G11C 13/0038 |
| 2019/0206489 | A1 * | 7/2019 | Wang | G11C 13/0004 |
| 2019/0252605 | A1 * | 8/2019 | Redaelli | H10N 70/24 |
| 2019/0252607 | A1 * | 8/2019 | Pirovano | H10N 70/826 |
| 2019/0362789 | A1 | 11/2019 | Tortorelli et al. | |
| 2020/0003591 | A1 * | 1/2020 | Iwashita | G01D 18/00 |
| 2020/0035917 | A1 | 1/2020 | Fratin et al. | |
| 2020/0091244 | A1 * | 3/2020 | Chan | H01L 23/53257 |
| 2020/0335551 | A1 * | 10/2020 | Tortorelli | H10N 70/8825 |
| 2021/0119123 | A1 * | 4/2021 | Redaelli | H10N 70/8825 |
| 2022/0140003 | A1 * | 5/2022 | Yang | H10N 70/063 257/4 |
| 2022/0149114 | A1 * | 5/2022 | Yang | H10N 70/882 |
| 2022/0190238 | A1 * | 6/2022 | Gong | H10N 70/826 |
| 2022/0199901 | A1 * | 6/2022 | Wu | H10N 70/8413 |
| 2022/0215876 | A1 * | 7/2022 | Ha | G11C 13/0009 |
| 2022/0246847 | A1 * | 8/2022 | Nugent | H10N 70/011 |
| 2023/0088249 | A1 * | 3/2023 | Yang | H10B 63/10 257/5 |
| 2023/0091136 | A1 * | 3/2023 | Yang | H10N 70/231 257/5 |
| 2023/0309422 | A1 * | 9/2023 | Gong | H10B 63/24 |
| 2024/0032308 | A1 * | 1/2024 | Yang | H10N 50/01 |
| 2024/0074210 | A1 * | 2/2024 | Yang | H10N 70/826 |
| 2024/0414926 | A1 * | 12/2024 | Yang | H10N 50/01 |
| 2025/0098558 | A1 * | 3/2025 | Sung | H10N 70/826 |
| 2025/0133970 | A1 * | 4/2025 | Choi | G11C 13/0069 |
| 2025/0275491 | A1 * | 8/2025 | Pirovano | G11C 13/003 |

FOREIGN PATENT DOCUMENTS

| | | | | | |
|---|---|---|---|---|---|
| CN | 118695600 | A | * | 9/2024 | H10B 43/35 |
| CN | 119654057 | A | * | 3/2025 | G11C 13/004 |
| CN | 119894006 | A | * | 4/2025 | H10N 70/20 |
| EP | 3996159 | A1 | * | 5/2022 | H10D 62/80 |
| EP | 4333604 | A1 | * | 3/2024 | H10N 70/20 |
| EP | 4435787 | A1 | * | 9/2024 | H10B 63/845 |
| EP | 4439562 | A1 | * | 10/2024 | H10B 63/845 |
| EP | 4525582 | A1 | * | 3/2025 | G11C 13/004 |
| EP | 4576981 | A1 | * | 6/2025 | H10B 43/35 |
| JP | 2022075571 | A | * | 5/2022 | G11C 13/0004 |
| JP | 2024137856 | A | * | 10/2024 | H10N 70/841 |
| JP | 2025043391 | A | * | 3/2025 | G11C 13/004 |
| KR | 10-2013-0033707 | A | | 4/2013 | |
| KR | 20170100224 | A | * | 9/2017 | H01L 45/1233 |
| KR | 10-2227971 | B1 | | 3/2021 | |
| KR | 102453349 | B1 | * | 10/2022 | H01L 45/1233 |
| KR | 102571566 | B1 | * | 8/2023 | H10N 50/85 |
| KR | 20240030817 | A | * | 3/2024 | H10N 70/20 |
| KR | 20250041586 | A | * | 3/2025 | H10B 63/84 |
| KR | 20250059183 | A | * | 5/2025 | H10N 70/20 |
| WO | WO-2015069468 | A1 | * | 5/2015 | H10N 70/841 |
| WO | WO-2015088921 | A1 | * | 6/2015 | H01L 21/76885 |
| WO | WO-2020261736 | A1 | * | 12/2020 | G11C 13/00 |

* cited by examiner

FIG. 7

| | UPPER PORTION | LOWER PORTION | ΔVth (V) | Vth_drift (mV/dec) |
|---|---|---|---|---|
| EMBODIMENT1 | GeAsSeS(Ge:23) 2nm | GeAsSeSIn(Ge:13) 14nm | 1.37 | 58.07 |
| COMPARATIVE EXAMPLE1 | GeAsSeS(Ge:23) 16nm | | 1.68 | 118.53 |
| COMPARATIVE EXAMPLE2 | GeAsSeSIn(Ge:13) 16nm | | 1.03 | 46.05 |

1X-1X'                1Y-1Y'

1X-1X'                1Y-1Y'

MEMORY DEVICE AND MEMORY APPARATUS COMPRISING THE SAME

CROSS-REFERENCE TO RELATED APPLICATION

This application claims the benefit of Korean Patent Application No. 10-2022-0110326, filed on Aug. 31, 2022 in the Korean Intellectual Property Office, the disclosure of which is incorporated herein in its entirety by reference.

BACKGROUND

1. Field

The disclosure relates to a memory device and a memory apparatus including the memory device, and more particularly, to a cross-point memory device and a memory apparatus comprising the cross-point memory device.

2. Description of the Related Art

With the trend of the miniaturization of electronic products, there is an increasing demand for high-density memory devices. A cross-point memory device has a memory structure in which an upper electrode and a lower electrode are arranged vertically crossing each other and a memory cell is disposed in an intersection area. The structure has a merit of having a small memory cell on a plane. However, a leakage current may be generated in a neighboring memory cell in a process of addressing a memory cell. There may be a limitation in increasing the capacity of a memory because one switching device corresponding to one memory cell may be necessary.

SUMMARY

Provided are a memory device which may simultaneously implement a memory function and a switching function with a single component, and a memory apparatus including the memory device.

Provided are a memory device having ovonic threshold switching characteristics, and a memory apparatus comprising the memory device.

Additional aspects will be set forth in part in the description which follows and, in part, will be apparent from the description, or may be learned by practice of the presented embodiments.

According to an example embodiment, a memory device may include a first electrode, a second electrode spaced apart from the first electrode, an intermediate layer between the first electrode and the second electrode, and an interface layer in contact with the intermediate layer. The intermediate layer may have ovonic threshold switching (OTS) characteristics. The interface layer may include a material having a threshold voltage shift greater than a threshold voltage shift ($\Delta$Vth) of the intermediate layer.

In some embodiments, the threshold voltage change rate (Vth_drift) of the intermediate layer may be less than the threshold voltage change rate of the interface layer.

In some embodiments, the threshold voltage change rate (Vth_drift) of the intermediate layer may be 60 mV/dec or less.

In some embodiments, each of the intermediate layer and the interface layer may include a chalcogen compound.

In some embodiments, the intermediate layer may include at least one of GeAsSeIn, GeAsSeSIn, GeAsTeSi, and GeAsSeTeSi.

In some embodiments, the interface layer may include GeAsSe.

In some embodiments, a ratio of germanium (Ge) in the interface layer may be greater than a ratio of Ge in the intermediate layer.

In some embodiments, the ratio of Ge in the interface layer may be 20% or more.

In some embodiments, the ratio of Ge in the intermediate layer may be less than 20%.

In some embodiments, the intermediate layer may be doped with a metal.

In some embodiments, a doping ratio of the metal may be 5% or less.

In some embodiments, the metal may include at least one of indium (In), aluminum (Al), silicon (Si), and gallium (Ga).

In some embodiments, a metal doping ratio of the interface layer may be less than a metal doping ratio of the intermediate layer.

In some embodiments, the interface layer may not be doped with a metal.

In some embodiments, the interface layer may be between the first electrode and the intermediate layer.

In some embodiments, the interface layer may be between the second electrode and the intermediate layer.

In some embodiments, the interface layer may include a first interface layer between the first electrode and the intermediate layer, and a second interface layer between second electrode and the intermediate layer.

According to an example embodiment, a memory apparatus may include a first electrode line extending in a first direction, a second electrode line spaced apart from the first electrode line and extending in a second direction crossing the first direction, and a memory device at an intersection of the first electrode line and the second electrode line. The memory device may be one of the memory devices discussed above.

In some embodiments, the first electrode may be in contact with the first electrode line, and the second electrode may be in contact with the second electrode line.

In some embodiments, the first electrode may be integrated with the first electrode line, and the second electrode may be integrated with the second electrode line.

In some embodiments, the memory apparatus may further include a circuit portion configured to drive the memory device or perform arithmetic processing.

BRIEF DESCRIPTION OF THE DRAWINGS

These and/or other aspects will become apparent and more readily appreciated from the following description of the embodiments, taken in conjunction with the accompanying drawings in which:

FIG. 7 shows a result of measurements of the threshold voltage shift (ΔVth) and the threshold voltage change rate (Vth_drift) of material layers having OTS characteristics;

DETAILED DESCRIPTION

Figure 1:
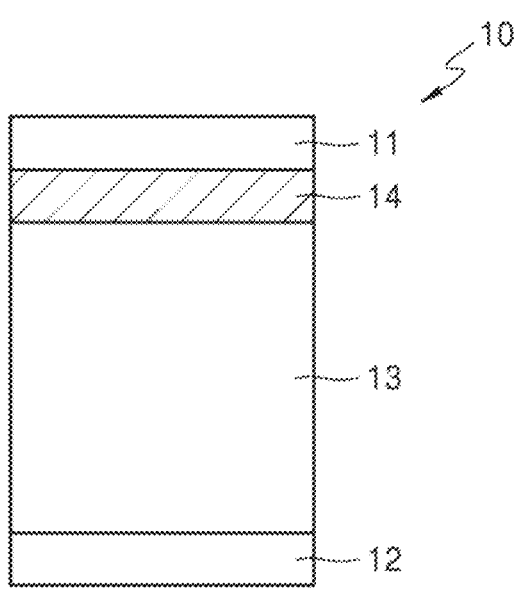
FIG. 1 is a view showing a memory device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

In the specification, expressions, such as "in some embodiments," "in an embodiment," or the like, appearing in various places, do not necessarily denote the same embodiment.

Some embodiments of the disclosure may be described in terms of functional block components and various processing steps. Such functional blocks may be realized by any number of hardware and/or software components configured to perform the specified functions. For example, the function blocks of the disclosure may be implemented by one or more microprocessors, or implemented by circuit configurations for a certain function. Furthermore, for example, the function blocks of the disclosure may be implemented by various programming or scripting languages. The function blocks may be implemented in algorithms that execute on one or more processors. Furthermore, the disclosure may employ any number of conventional techniques for electronics configuration, signal processing and/or control, data processing and the like. The words "mechanism" and "element" are used broadly and are not limited to mechanical or physical embodiments, but may include software routines in conjunction with processors, etc.

Furthermore, connection lines or connection members between the constituent elements shown in the drawings are merely illustrative of functional connections and/or physical or circuit connections. In an actual device, a connection between the constituent elements may be indicated by various functional connections, physical connections, or circuit connections that can be replaced or added.

Terms such as "include" or "comprise" may not be construed to necessarily include any and all constituent elements or steps described in the specification, but may be construed to exclude some of the constituent elements or steps or further include additional constituent elements or steps.

When a constituent element is disposed "above" or "on" to another constituent element, the constituent element may include not only an element directly contacting on the upper/lower/left/right sides of the other constituent element, but also an element disposed above/under/left/right the other constituent element in a non-contact manner. Hereinafter, embodiments will be described in detail only for an example with reference to the accompanying drawings.

Terms such as "first" and "second" are used herein merely to describe a variety of constituent elements, but the constituent elements are not limited by the terms. Such terms are used only for the purpose of distinguishing one constituent element from another constituent element.

Hereinafter, the disclosure is described in detail with reference to the accompanying drawings.

FIG. 1 is a view showing a memory device 10 according to an embodiment. Referring to FIG. 1, the memory device 10 may include a first electrode 11, a second electrode 12 spaced apart from the first electrode 11, an intermediate layer 13 having ovonic threshold switching (OTS) characteristics and disposed between the first electrode 11 and the second electrode 12, and an interface layer 14 in contact with the intermediate layer 13 and including a material having a threshold voltage shift greater than a threshold voltage shift (Δ Vth) of the intermediate layer 13.

Each of the first electrode 11 and the second electrode 12 may independently include a metal, a conductive metal nitride, a conductive metal oxide, or a combination thereof. For example, each of the first electrode 11 and the second electrode 12 may independently include one or two or more materials selected from among, for example, carbon (C), a titanium nitride (TiN), a titanium silicon nitride (TiSiN), a titanium carbon nitride (TiCN), a titanium carbon silicon nitride (TiCSiN), a titanium aluminum nitride (TiAlN), tantalum (Ta), a tantalum nitride (TaN), tungsten (W), and a tungsten nitride (WN).

The intermediate layer 13 having OTS characteristics may be disposed between the first electrode 11 and the second electrode 12. The intermediate layer 13 may include an amorphous chalcogen compound having OTS characteristics. For example, the intermediate layer 13 may include GeAsSe. Alternatively, the intermediate layer 13 may include at least one of GeAsSeIn, GeAsSeSIn, GeAsTeSi, and GeAsSeTeSi.

Figure 2:
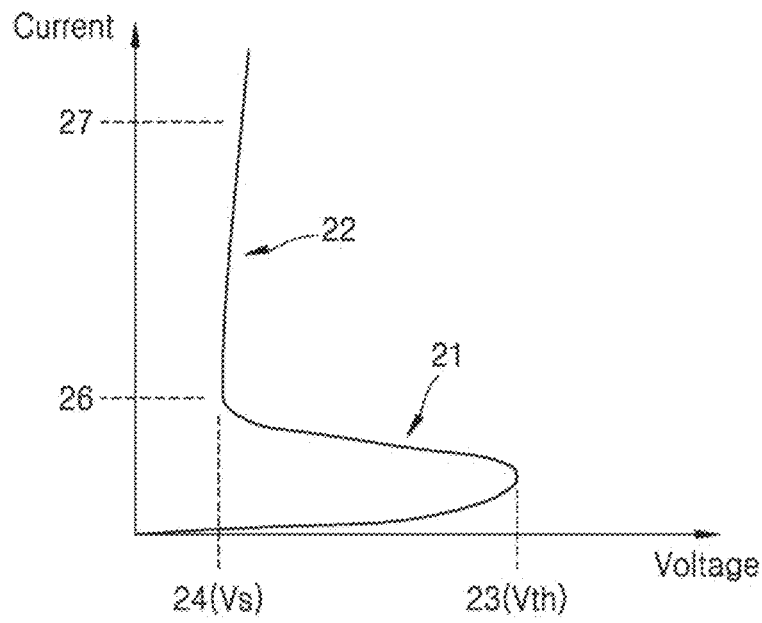
FIG. 2 is a graph schematically showing a voltage-current curve of an intermediate layer having ovonic threshold switching (OTS) characteristics.

The intermediate layer 13 may be doped with a metal. A doping ratio of a metal in the intermediate layer 13 may be about 5% or less with respect to the intermediate layer 13. The metal may include, for example, at least one of indium (In), aluminum (Al), silicon (Si), and gallium (Ga). FIG. 2 is a graph schematically showing a voltage-current curve of the intermediate layer 13 having OTS characteristics.

Referring to FIG. 2, a first curve 21 shows a voltage-current relationship in a state in which a current hardly flows in the intermediate layer 13. When a voltage gradually increases from a state in which a voltage and a current both are 0, the intermediate layer 13 remains in a high resistance state, in which almost no current flows, until the voltage reaches a threshold voltage Vth (a first voltage level 23). However, as soon as the voltage exceeds the threshold voltage Vth, the intermediate layer 13 becomes a low resistance state, and thus, the current flowing in the intermediate layer 13 may increase rapidly, and the voltage applied to the intermediate layer 13 may decrease to a saturation voltage Vs (a second voltage level 24).

A second curve 22 denotes a voltage-current relationship in a state in which a current smoothly flows in the intermediate layer 13. As the current flowing in the intermediate layer 13 increases greater than a first current level 26, the voltage applied to the intermediate layer 13 may increase slightly greater than the second voltage level 24. For example, while the current flowing in the intermediate layer 13 considerably increases from the first current level 26 to a second current level 27, the voltage applied to the intermediate layer 13 may slightly increase from the second voltage level 24. In other words, once the current flows through the intermediate layer 13, the voltage applied to the intermediate layer 13 may be maintained almost at the saturation voltage Vs.

When the current decreases to the first current level 26 or less, the intermediate layer 13 may be changed to the high resistance state again, and effectively block the current until the voltage increases to the threshold voltage Vth. Due to the characteristics described above, the intermediate layer 13 may acts as a switching device.

Figure 3:
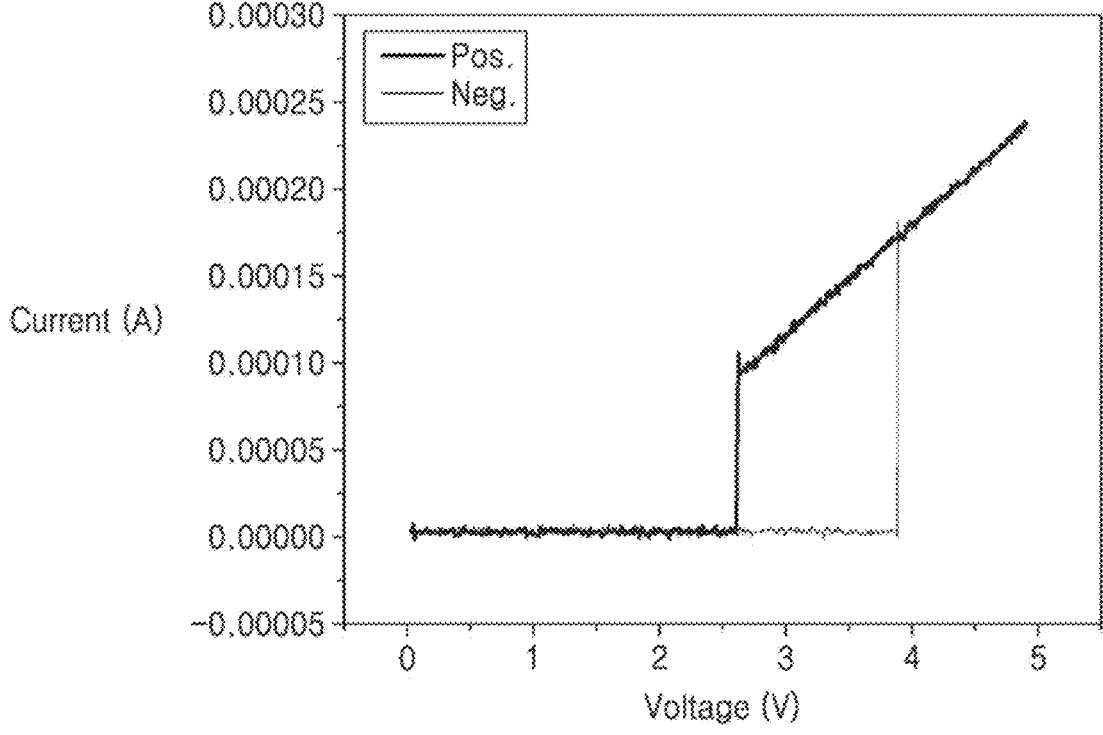
FIG. 3 is a graph showing a voltage-current curve according to the polarity of a bias voltage applied to an intermediate layer having OTS characteristics, according to an embodiment.

FIG. 3 is a graph showing a voltage-current curve according to the polarity of a bias voltage applied to the intermediate layer 13 having OTS characteristics, according to an embodiment.

Referring to FIG. 3, when a bias voltage having a negative pulse direction is applied, the threshold voltage of the intermediate layer 13 is about 4 V. In other words, when a bias voltage having the absolute value of less than 4 V is applied, the intermediate layer 13 may be in a high resistance state, and when a bias voltage having the absolute value exceeding 4 V is applied, the intermediate layer 13 may be in a low resistance state.

When a bias voltage having a positive pulse direction is applied, the threshold voltage of the intermediate layer 13 is about 2.5 V. In other words, when a bias voltage having the absolute value of less than 2.5 V, the intermediate layer 13 may be in a high resistance state, and when a bias voltage having the absolute value exceeding 2.5 V is applied, the intermediate layer 13 may be in a low resistance state. It may be seen that the threshold voltage is shifted according to the polarity of a bias voltage. The threshold voltage shift ($\Delta$Vth) may mean that the intermediate layer 13 may be used as the memory device 10.

Figure 4A:
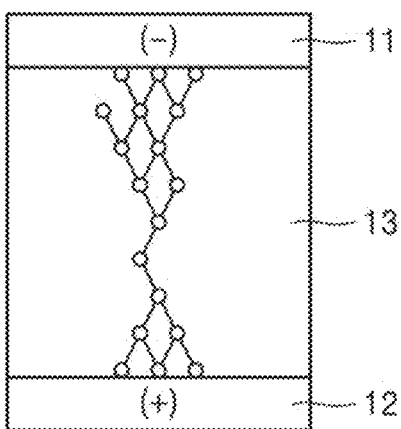
FIGS. 4A and 4B are reference views for explaining a threshold voltage shift (ΔVth) phenomenon in a GeAsSe-based intermediate layer, according to an embodiment.
Figure 4B:
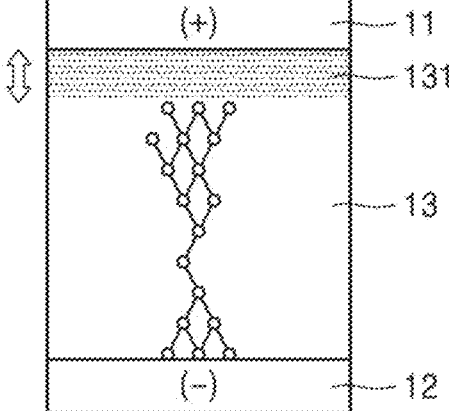

FIGS. 4A and 4B are reference views for explaining a threshold voltage shift ($\Delta$Vth) phenomenon in the intermediate layer 13 based on GeAsSe, according to an embodiment. Referring to FIG. 4A, after the initial driving (generally referred to as a first-firing process), an activated state trap is formed in the intermediate layer 13 that is based on GeAsSe, and thus, a percolation path may be formed. For example, a negative voltage may be applied to the first electrode 11, and a positive voltage may be applied to the second electrode 12. The percolation path may be formed in the intermediate layer 13. A GeAsSe-based material having OTS characteristics has an amorphous structure so that trap sites having very various origins may exist therein. Among them, a considerable number of trap sites may be formed according to a bonding state related to germanium (Ge) and selenium (Se). The trap site may be easily changed to an activated state, and as the activated states form a percolation path, the threshold voltage of the intermediate layer 13 may be reduced and the reduced threshold voltage may be maintained.

Referring to FIG. 4B, a reverse bias voltage may be applied to the first and second electrodes 11 and 12. For example, a positive voltage may be applied to the first electrode 11, and a negative voltage may be applied to the second electrode 12. In an area adjacent to an electrode in the intermediate layer 13, for example, an area 131 adjacent to the first electrode 11, activated state traps are repulsed so as to be a de-trapped region. The de-trapped region may shift the threshold voltage.

The greater the threshold voltage shift ($\Delta$Vth) is, the better the memory device 10 may operate as the memory device 10. The memory device 10 according to an embodiment may further include the interface layer 14 between the intermediate layer 13 and the electrode, for example, the first electrode 11, the interface layer 14 including a material having a threshold voltage shift greater than the threshold voltage shift of the intermediate layer 13. The thickness of the interface layer 14 may be less than the thickness of the intermediate layer 13. For example, a thickness ratio of the interface layer 14 to the intermediate layer 13 may be about 5% or more and 20% or less. The thickness of the intermediate layer 13 may be about 10 nm or more and 30 nm or less, and the thickness of the interface layer 14 may be about 1 nm or more and 3 nm or less.

The interface layer 14 may have OTS characteristics. The interface layer 14 may include a chalcogen compound. As the shift of threshold voltage is generated by the repulsion of activated state traps, the interface layer 14 may include a material that forms a lot of activated states. For example, the interface layer 14 may be based on GeAsSe, and a ratio of Ge included in the interface layer 14 may be greater than a ratio of Ge included in the intermediate layer 13.

Figure 5:
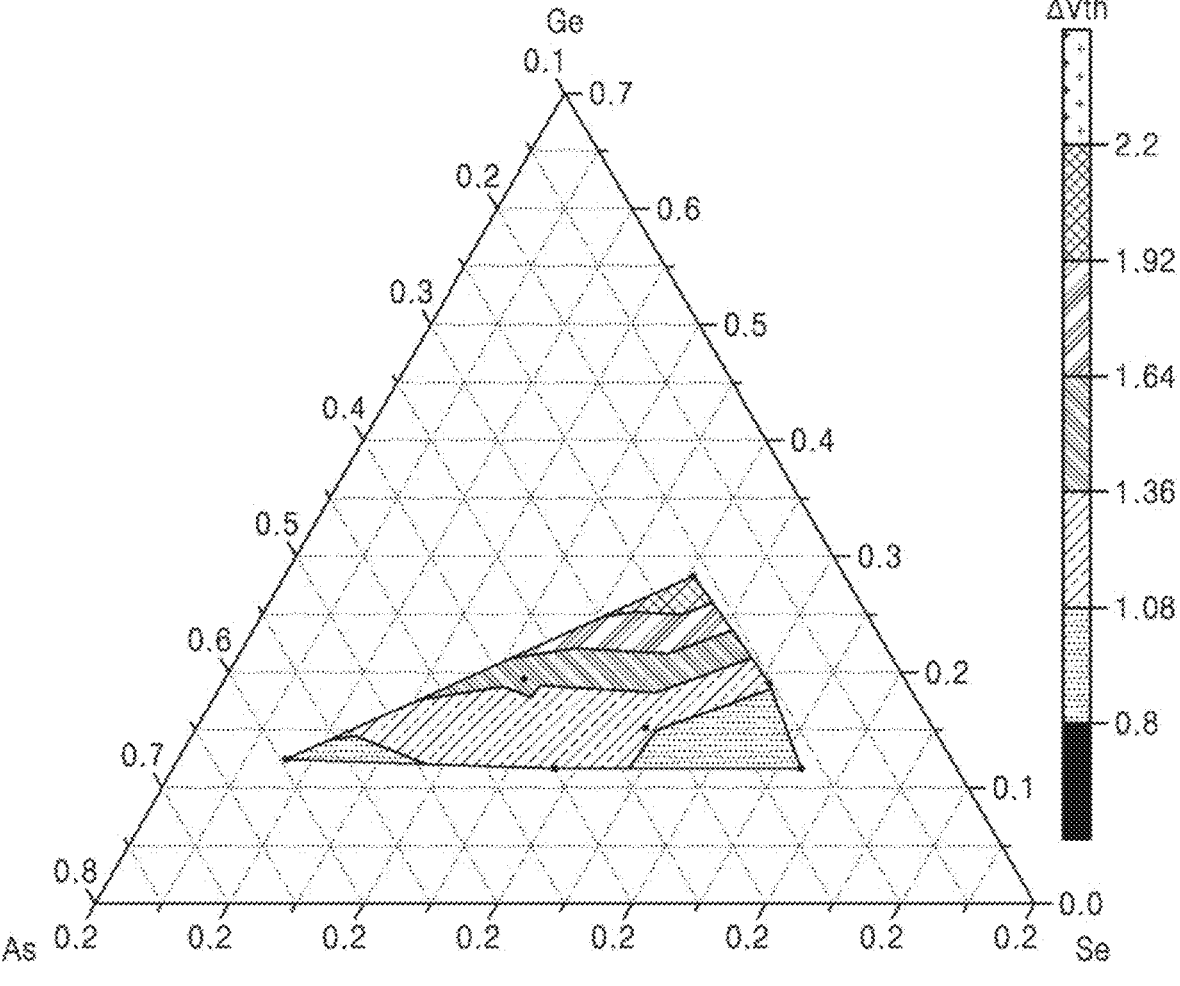
FIG. 5 is a view showing a threshold voltage shift (ΔVth) according to the element composition ratio of a GeAsSe material.
Figure 6:
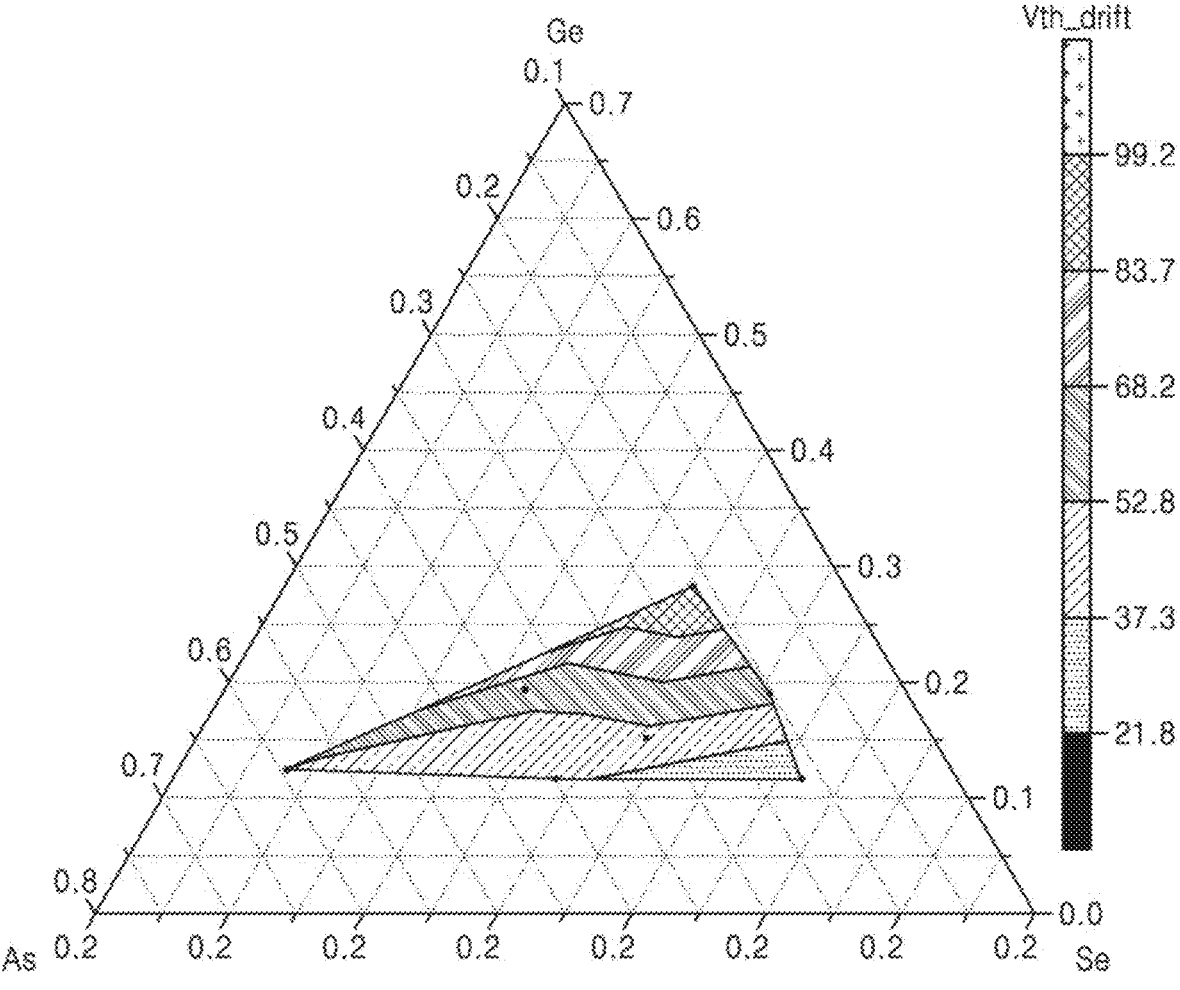
FIG. 6 is a view showing a threshold voltage change rate (Vth_drift) according to the element composition ratio of a GeAsSe material.

FIG. 5 is a view showing a threshold voltage shift ($\Delta$Vth) according to the element composition ratio of a GeAsSe material, and FIG. 6 is a view showing a threshold voltage change rate (Vth_drift) according to the element composition ratio of a GeAsSe material.

Referring to FIG. 5, it may be seen that the greater the Ge ratio is, the greater is the threshold voltage shift. The interface layer 14 according to an embodiment may have a Ge ratio of about 20% or more. When the thickness of the interface layer 14 is about 16 nm, the threshold voltage shift of the interface layer 14 may be about 1.5 V or more. The threshold voltage shift of the interface layer 14 is proportional to the thickness of the interface layer 14, and when the thickness of the interface layer 14 is about 10 nm or less, the threshold voltage shift of the interface layer 14 may be about 1 V or more.

The threshold voltage change rate (Vth_drift) is a phenomenon occurring by trap annihilation according to structural relaxation in an amorphous chalcogen compound. A great threshold voltage change rate (Vth_drift) means that traps are well annihilated, and thus, the threshold voltage change rate (Vth_drift) and the threshold voltage shift ($\Delta$Vth) are in a trade-off relationship.

Referring to FIG. 6, it may be seen that the greater the Ge ratio is, the greater is the threshold voltage change rate (Vth_drift). To reduce the threshold voltage change rate (Vth_drift), the intermediate layer 13 according to an embodiment may include Ge in amount of as little as possible. For example, the ratio of Ge included in the intermediate layer 13 may be less than about 20%. The change rate (Vth_drift) of the threshold voltage of the intermediate layer 13 may be about 60 mV/dec or less.

Alternatively, the intermediate layer 13 may be doped with a metal. A ratio of a metal doped in the intermediate layer 13 may be about 5% or less, compared with the intermediate layer 13. The metal may include, for example, at least one of In, Al, Si, and Ga. As the intermediate layer 13 is doped with a metal, the metal and Ge are stably bonded to each other, and thus, the occurrence of structural relaxation in the intermediate layer 13 may be reduced. Accordingly, the threshold voltage change rate (Vth_drift) of the intermediate layer 13 may be reduced.

The interface layer 14 may also be doped with a metal. A metal doping ratio of the interface layer 14 may be less than the metal doping ratio of the intermediate layer 13. Alternatively, the interface layer 14 may not be doped with a metal.

FIG. 7 shows a result of measurements of the threshold voltage shift (ΔVth) and the threshold voltage change rate (Vth_drift) of material layers having OTS characteristics.

In Embodiment 1, an upper layer is formed of GeAsSeS having a Ge ratio of 23% to a thickness of 2 nm, and a lower layer is formed of GeAsSeSIn having a Ge ratio of 13% to a thickness of 13 nm. In a layer in which the upper layer and the lower layer are coupled to each other, the results of measurement of the threshold voltage shift (ΔVth) and the threshold voltage change rate (Vth_drift) are 1.37 V and 58.07 mV/dec, respectively.

Comparative example 1 is formed of GeAsSeS having a Ge ratio of 23% to a thickness of 16 nm. The threshold voltage shift (ΔVth) and the threshold voltage change rate (Vth_drift) of Comparative example 1 are 1.68 V and 118.53 mV/dec, respectively. Comparative example 2 is formed of GeAsSeSIn having a Ge ratio of 13% to a thickness of 16 nm. The threshold voltage shift (ΔVth) and the threshold voltage change rate (Vth_drift) of Comparative example 2 are 1.03 V and 45.05 mV/dec, respectively.

Comparing Comparative example 1 with Comparative example 2, it may be seen that the greater the Ge ratio is, the greater is the threshold voltage shift (ΔVth). However, it may be seen that it is a problem that the greater the Ge ratio is, the greater is the threshold voltage change rate (Vth_drift) as well. However, in Embodiment 1, in which the interface layer 14 includes a material having a high Ge ratio and the intermediate layer 13 includes a material having a low Ge ratio, it may be seen that the threshold voltage shift (ΔVth) is high at about 1.37 V and the threshold voltage change rate (Vth_drift) is low at about 58.07 mV/dec.

When the intermediate layer 13 having OTS characteristics and a low threshold voltage change rate (Vth_drift) and the interface layer 14 having a high threshold voltage shift (ΔVth) are applied to the memory device 10, it may be expected that the switching function and the memory function may be simultaneously and stably performed.

Figure 8:
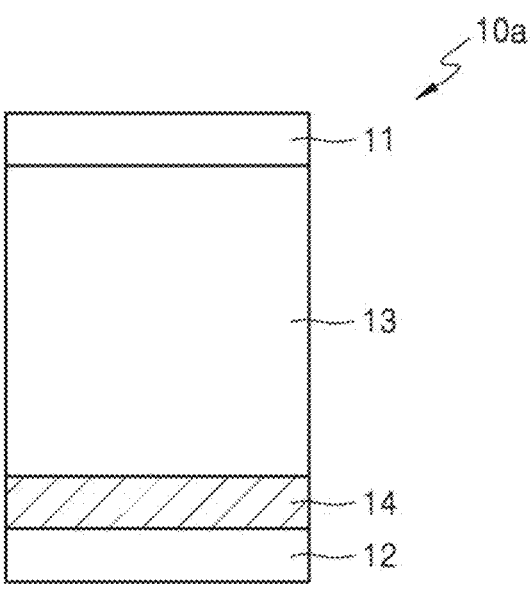
FIG. 8 is a view showing a memory device including an interface layer between an intermediate layer and a second electrode, according to an embodiment.

FIG. 8 is a view showing a memory device 10a including the interface layer 14 between the intermediate layer 13 and the second electrode 12, according to an embodiment. Comparing FIG. 1 with FIG. 8, in the memory device 10a of FIG. 8, the interface layer 14 may be disposed between the intermediate layer 13 and the second electrode 12.

The intermediate layer 13 and the interface layer 14 both may be formed of a material having OTS characteristics. For example, the intermediate layer 13 and the interface layer 14 may each include an amorphous chalcogen compound, and may include GeAsSe. The threshold voltage shift of the interface layer 14 may be greater than the threshold voltage shift of the intermediate layer 13, and the threshold voltage change rate of the intermediate layer 13 may be less than the threshold voltage change rate of the interface layer 14. For example, the threshold voltage shift of the interface layer 14 may be about 1 V or more, and the threshold voltage change rate of the intermediate layer 13 may be about 60 mV/dec or less. The Ge ratio of the interface layer 14 may be greater than the Ge ratio of the intermediate layer 13. The intermediate layer 13 may be doped with a metal, and the interface layer 14 may not be doped with a metal.

Figure 9A:
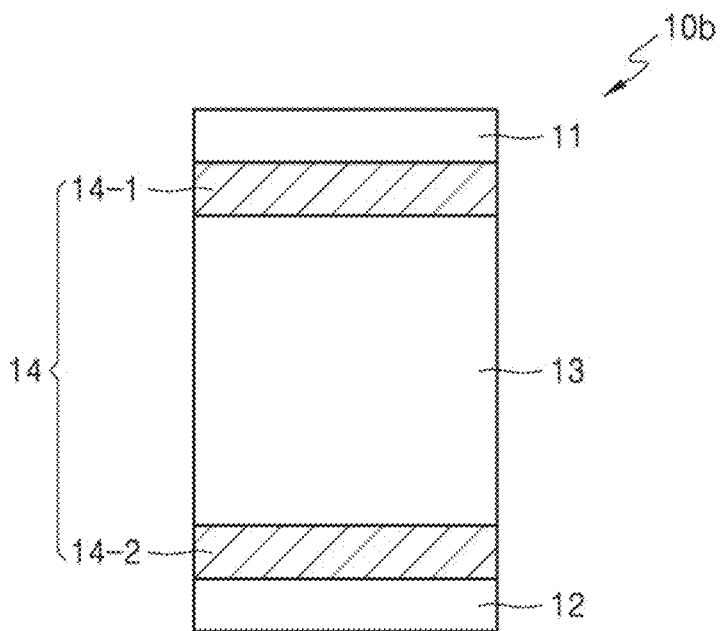
FIGS. 9A, 9B, and 9C are views showing memory devices including a plurality of interface layers, according to some embodiments.
Figures 9B, 9C:
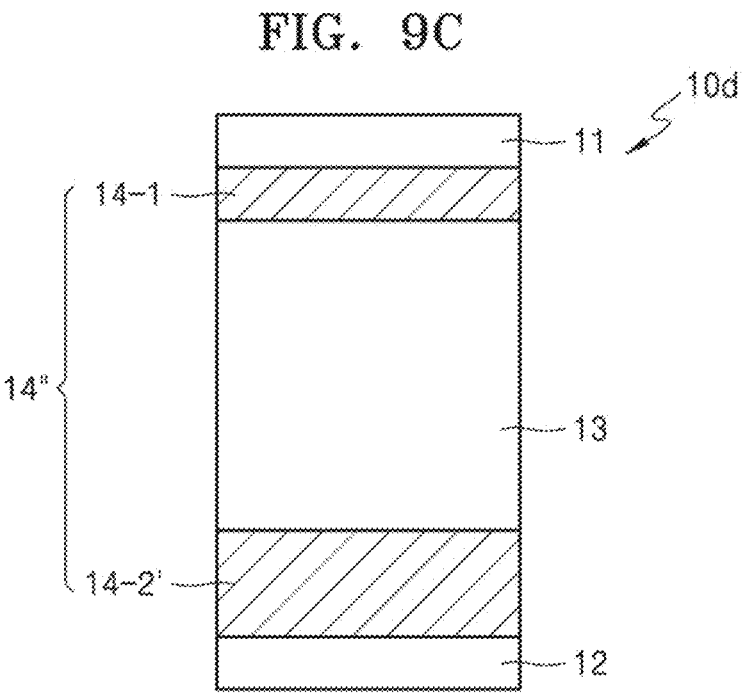

FIGS. 9A, 9B, and 9C are views showing memory devices including a plurality of interface layers, according to some embodiments FIG. 9A is a view showing a memory device 10b including a plurality of interface layers 14, according to an embodiment. Comparing FIG. 1 with FIG. 9A, the memory device 10b of FIG. 9A may include a first interface layer 14-1 disposed between the first electrode 11 and the intermediate layer 13, and a second interface layer 14-2 disposed between the intermediate layer 13 and the second electrode 12. The relationship between the first interface layer 14-1 and the intermediate layer 13 is described above in FIG. 1, and the relationship between the second interface layer 14-2 and the intermediate layer 13 is described in FIG. 8, and thus, detailed descriptions thereof are omitted.

FIGS. 9B and 9C are views showing memory devices 10c and 10d including a plurality of interface layers 14 according to some embodiments. Comparing FIG. 9A with FIGS. 9B and 9C, the memory device 10c of FIG. 9B and the memory device 10d of FIG. 9C may be the same as the memory device 10b of FIG. 9A except the first interface layer 14-1' and the second interface layer 14-2 of the memory device 10c in FIG. 9B and the first interface layer 14-1 and the second interface layer 14-2' of the memory device 10d in FIG. 9C may have different thicknesses. As shown in FIG. 9B, the first interface layer 14-1' may be thicker than the second interface layer 14-2 in the memory device 10c in FIG. 9B. As shown in FIG. 9C, the first interface layer 14-1 may be thinner than the second interface layer 14-2' in the memory device 10d in FIG. 9C.

Figure 10A:
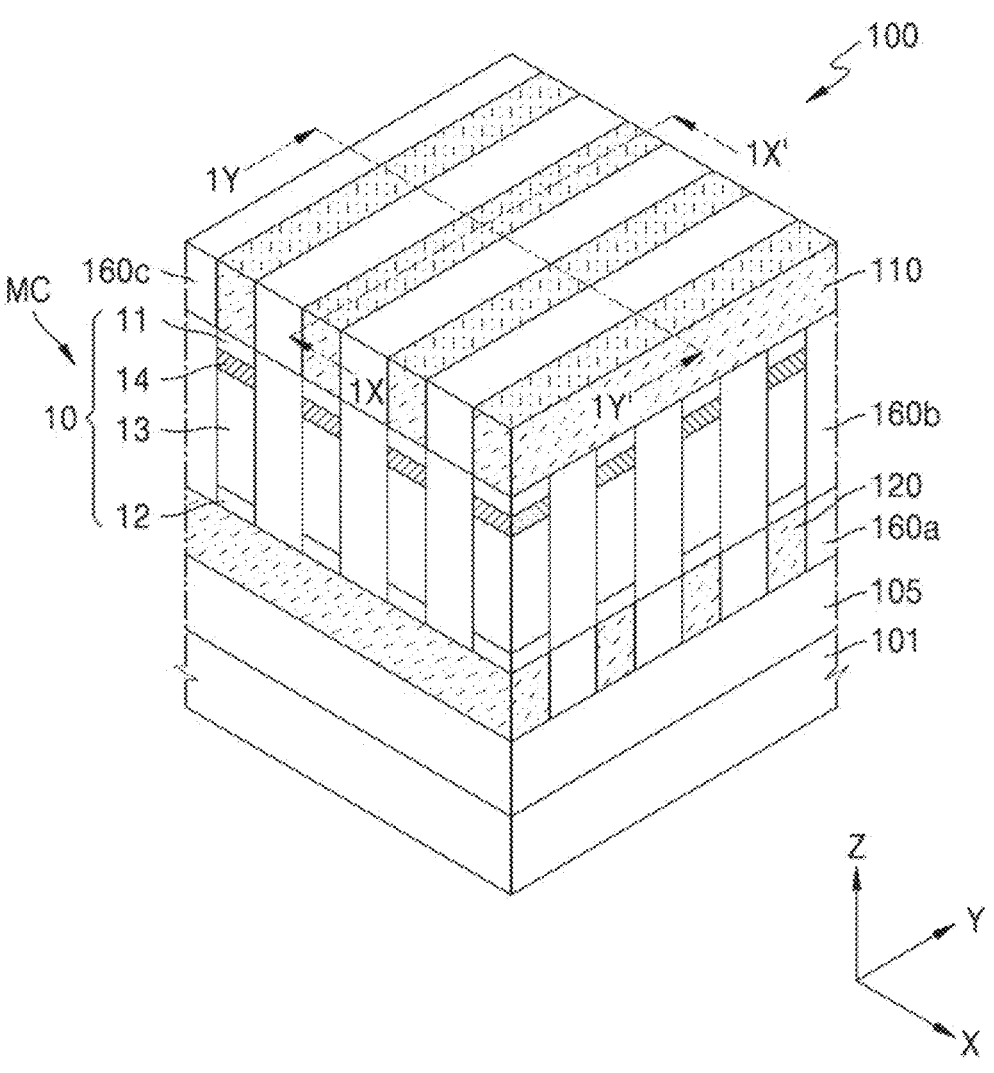
FIG. 10A is a perspective view of a semiconductor apparatus according to an embodiment.
Figure 10B:
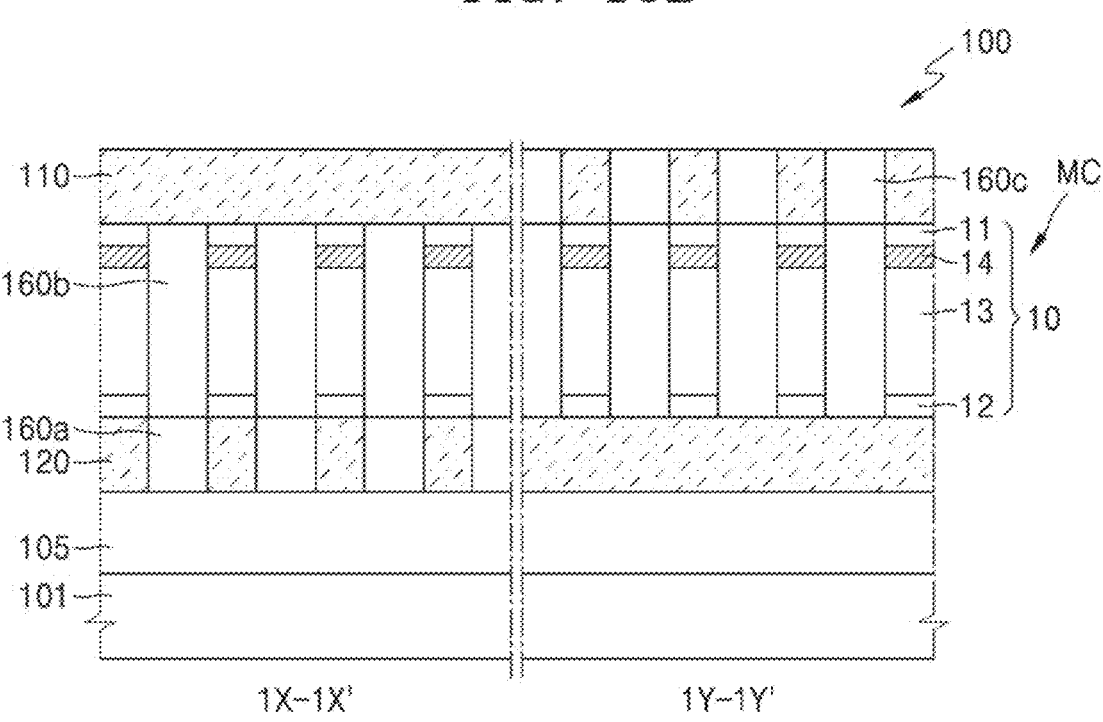
FIG. 10B is a cross-sectional view of a semiconductor apparatus according to an embodiment.

FIGS. 10A and 10B are, respectively, a perspective view and a cross-sectional view of a semiconductor apparatus 100 according to an embodiment. Referring to FIGS. 10A and 10B, the semiconductor apparatus 100 may include, on a substrate 101, a plurality of first electrode lines 110 extending in a first direction (for example, a Y direction), a plurality of second electrode lines 120 spaced apart from the first electrode lines 110 and extending in a second direction (for example, an X direction), and a plurality of memory devices MC.

The first electrode lines 110 may extend in the first direction (for example, the Y direction) parallel to each other. The second electrode lines 120 may extend in the second direction (for example, the X direction) parallel to each other. The X direction and the Y direction of FIG. 10A may orthogonally cross each other, but the disclosure is not limited thereto. In terms of driving of a semiconductor apparatus, the first electrode lines 110 may correspond to one of word lines and bit lines, and the second electrode lines 120 may correspond to the other one.

The first electrode lines 110 and the second electrode lines 120 may each include independently a metal, a conductive metal nitride, a conductive metal oxide, or a combination thereof. For example, the first electrode lines 110 and the second electrode lines 120 may each include independently W, WN, Au, Ag, Cu, Al, TiAlN, Ir, Pt, Pd, Ru, Zr, Rh, Ni, Co, Cr, Sn, Zn, ITO, an alloy thereof, or a combination thereof. Furthermore, the first electrode lines 110 and the second electrode lines 120 may each include independently a metal film and a conductive barrier layer covering part or the whole of the metal film. The conductive barrier layer may include, for example, Ti, TiN, Ta, TaN, or a combination thereof.

The memory devices MC may be spaced apart from each other, and may have a three-dimensional structure such that the memory devices MC are disposed between the first electrode lines 110 and the second electrode lines 120 in portions where the first electrode lines 110 and the second electrode lines 120 cross each other.

The memory devices MC may be the memory device 10 including the first electrode 11, the interface layer 14, the intermediate layer 13, and the second electrode 12, as illustrated in FIG. 1. However, the disclosure is not limited thereto. The memory devices 10a, 10b, 10c, and 10d illustrated in FIGS. 8, 9A, 9B, and 9C may be employed therefor. In the memory device according to an embodiment, the intermediate layer 13 and the interface layer 14 perform the switching function and the memory function, respectively, and thus, a separate variable resistance layer and the like is unnecessary.

The memory devices MC may each have a pillar shape. For example, the memory devices MC may have a rectangular pillar shape as illustrated in FIGS. 10A and 10B, or various pillar shapes, such as a cylindrical shape, an oval pillar shape, a polygonal pillar shape, and the like.

Furthermore, the memory devices MC, as illustrated in FIGS. 10A and 10B, may have a side surface perpendicular to the substrate 101, that is, the area of a cross-section that is parallel to a stack direction (Z direction) is constant. However, this is an example, and the memory devices MC may each have a structure in which a lower portion is wider than an upper portion, or the upper portion is wider than the lower portion.

An insulating layer may be disposed between the first electrode lines 110, between the second electrode lines 120, and/or between the memory devices 10. In detail, a first insulating layer 160a may be disposed between the first electrode lines 110, a second insulating layer 160b may be disposed between the memory devices MC separated from each other, and a third insulating layer 160c may be disposed between the second electrode lines 120. The first insulating layer 160a, the second insulating layer 160b, and/or the third insulating layer 160c may each include a dielectric material including an oxide and/or a nitride, and may include the same material or different materials. Furthermore, the first insulating layer 160a, the second insulating layer 160b, and/or the third insulating layer 160c may each be an air gap. In this case, an insulating liner (not shown) may be formed between the first electrode lines 110, the second electrode lines 120, or the memory device 10 and the air gap.

The substrate 101 may include, for example, a semiconductor material, such as Ge, silicon germanium (SiGe), silicon carbide (SiC), gallium arsenic (GaAs), indium arsenic (InAs), indium phosphide (InP), and the like, and may include an insulating material, such as a silicon oxide, a silicon nitride, a silicon oxynitride, and the like.

The semiconductor apparatus 100 may further include an interlayer insulating layer 105 on the substrate 101. The interlayer insulating layer 105 is disposed between the substrate 101 and the first electrode lines 110, and may electrically separate the substrate 101 and the first electrode lines 110 from each other. The interlayer insulating layer 105 may include an oxide such as a silicon oxide and/or a nitride such as a silicon nitride.

Figure 11:
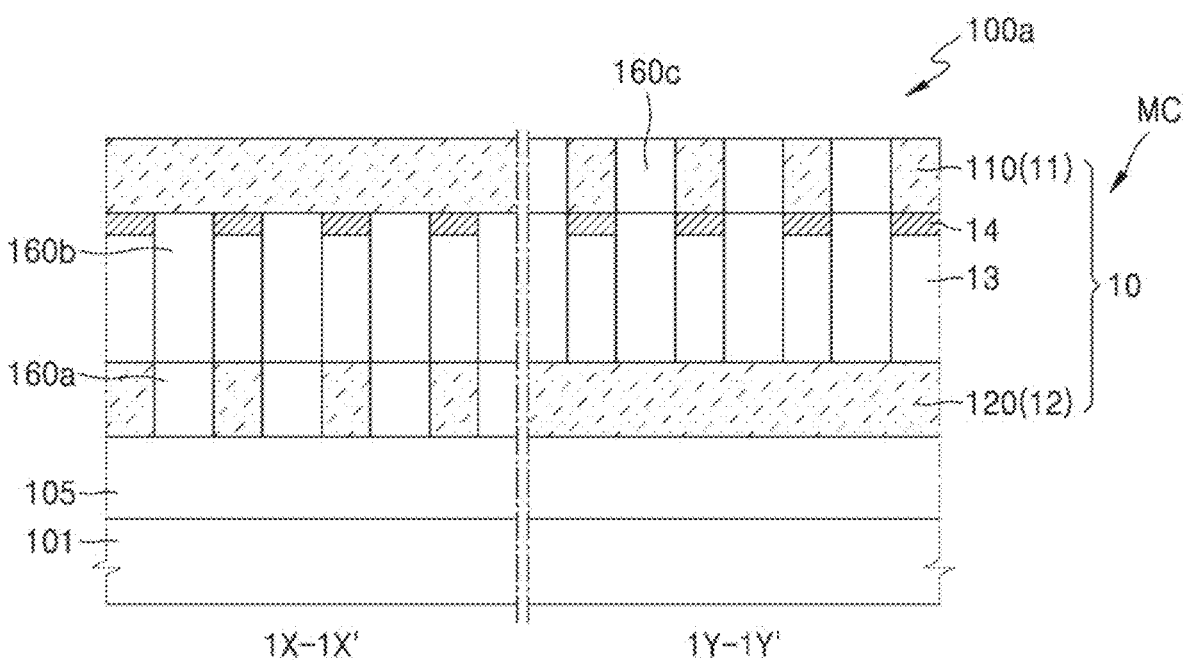
FIG. 11 is a cross-sectional view of a memory apparatus in which electrodes and electrode lines are integrated, according to an embodiment.

FIG. 11 is a cross-sectional view of a memory apparatus in which electrodes and electrode lines are integrated, according to an embodiment. Comparing FIG. 10B with FIG. 11, the memory apparatus of FIG. 11 may not separately include the first and second electrodes 11 and 12. Areas of the first electrode lines 110 in contact with the interface layer 14 may become the first electrode 11, and areas of the second electrode lines 120 in contact with the intermediate layer 13 may become the second electrode 12. The integration of the electrode and the electrode line may further simplify the structure of a memory apparatus.

Figure 12:
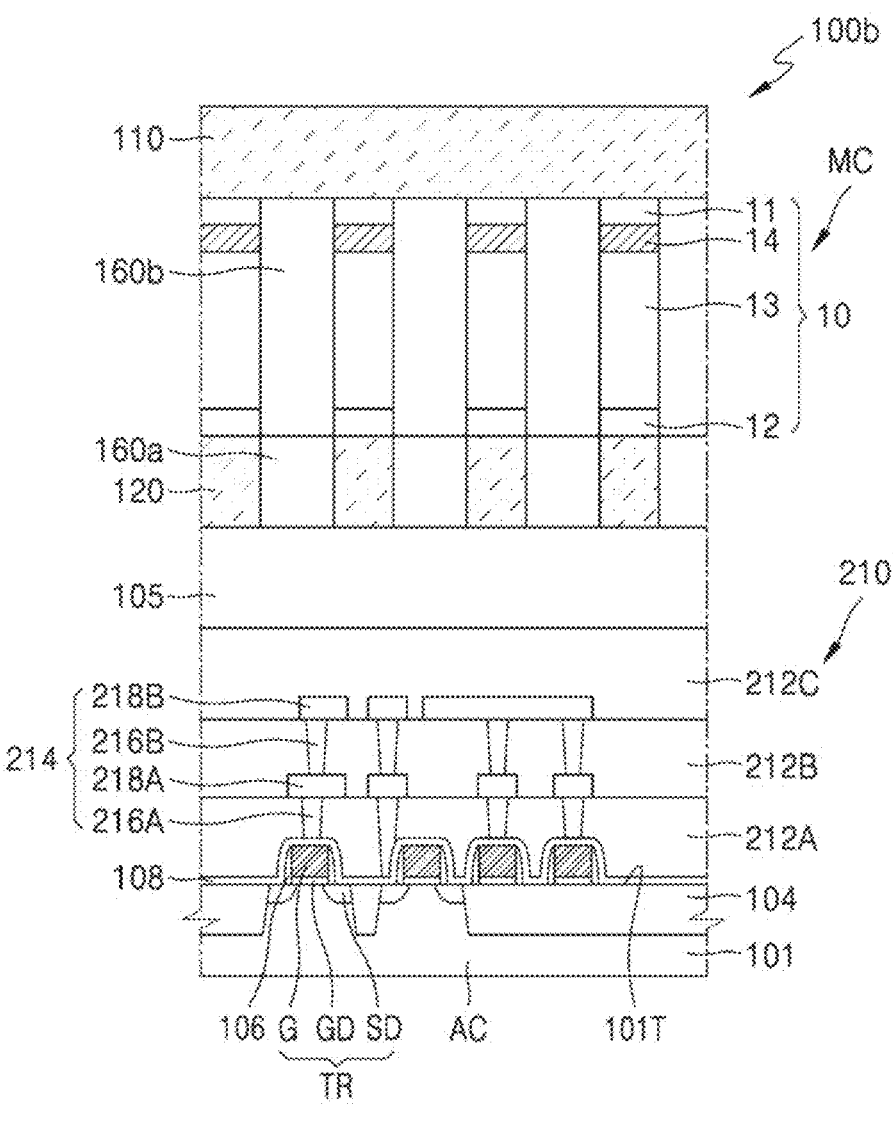
FIG. 12 is a cross-sectional view of a memory apparatus including a drive circuit area, according to an embodiment.

FIG. 12 is a cross-sectional view of a memory apparatus 100b including a drive circuit area, according to an embodiment. Referring to FIG. 12, the semiconductor apparatus may further include a drive circuit area 210 on a substrate. The drive circuit area 210 may include a memory device, such as a circuit portion such as a peripheral circuit, a drive circuit, a core circuit, or the like for driving MC or performing arithmetic processing. The circuits may include, for example, a page buffer, a latch circuit, a cache circuit, a column decoder, a sense amplifier, a data in/out circuit, a row decoder, or the like. Furthermore, these circuits may be disposed between the substrate and the memory device 10. In other words, the drive circuit area 210 and the memory device 10 may be sequentially disposed on the substrate 101, and such an arrangement structure may be a cell on periphery (COP) structure.

The drive circuit area 210 may include one or two more transistors TR and a wiring structure 214 electrically connected to the transistors TR.

Each of the transistors TR may be disposed on an active area AC of the substrate 101 defined by a device separation film 104. Each of the transistors TR may include a gate G, a gate insulating film GD, and source/drain SD. Furthermore, an insulating spacer 106 may be disposed in both side walls of the gate G, and an etching stop film 108 may be disposed on the gate G and/or the insulating spacer 106. The etching stop film 108 may include an insulating material, such as a Si nitride, a Si oxynitride, and the like.

The wiring structure 214 may be arranged by an appropriate number and at an appropriate position according to the layout of the drive circuit area 210, the type and arrangement of the gate G, and the like. The wiring structure 214 may have a multilayer structure of two layers or more. In detail, the wiring structure 214 may include, as illustrated in FIG. 12, a first contact 216A, a first wiring 218A, a second contact 216B, and a second wiring 218B, which are electrically connected to each other and sequentially stacked on the substrate 101. The first contact 216A, the first wiring 218A, the second contact 216B, and the second wiring 218B may each include independently a metal, a conductive metal nitride, a metal silicide, or a combination thereof, and include a conductive material, such as tungsten, molybdenum, titanium, cobalt, tantalum, nickel, tungsten silicide, titanium silicide, cobalt silicide, tantalum silicide, nickel silicide, and the like.

The wiring structure 214 may include interlayer insulating films 212A, 212B, and 212C for electrically separating the elements. Referring to FIG. 12, the interlayer insulating films 212A, 212B, and 212C may be disposed between the transistors TR, between the first and second wirings 218A and 218B, and/or between a plurality of contacts 216A and 216B. The interlayer insulating films 212A, 212B, and 212C may each include a silicon oxide, a silicon oxynitride, a silicon oxynitride, and the like.

The semiconductor apparatus 100*b* may further include a wiring structure (not shown) for electrically connecting the memory devices MC with the drive circuit area 210, and the wiring structure may be disposed by penetrating the interlayer insulating layer 105.

Thus, the structures of a memory device and a memory apparatus may be simplified because a material having OTS characteristics may simultaneously perform a switching function and a memory function.

Such a device and/or an apparatus may realize an improved density, and thus, may contribute to the miniaturization of electronic apparatuses.

In some example embodiments, memory devices MC, 10, 10*b*, 10*c*, and 10*d* and semiconductor apparatuses 100, 100*a*, and 100*b* may be applied to an electronic apparatus. For example, FIG. 13 is a block diagram of an electronic apparatus according to an example embodiment.

Figure 13:
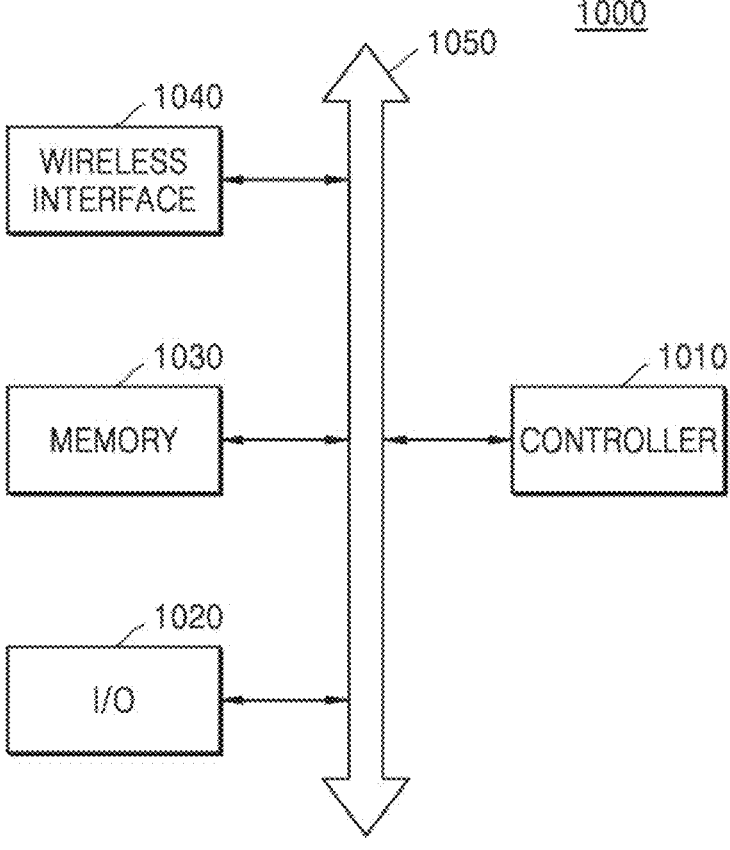
FIG. 13 is a block diagram of an electronic apparatus according to an embodiment.

Referring to FIG. 13, an electronic apparatus 1000 may include a controller 1010, an input/output device (I/O) 1020, a memory 1030, and a wireless interface 1040, and these components are interconnected to each other through a bus 1050. Optionally, the electronic apparatus 1000 may further include an image sensor (not shown) and/or a display (not shown) connected to the bus 1050.

The controller 1010 may include at least one of a microprocessor, a digital signal processor, and a processing device similar thereto. The I/O device 1020 may include at least one of a keypad, a keyboard, and a display. The memory 1030 may be used to store instructions executed by controller 1010. For example, the memory 1030 may be used to store user data. The electronic apparatus 1000 may use the wireless interface 1040 to transmit/receive data through a wireless communication network. The wireless interface 1040 may include an antenna and/or a wireless transceiver. In some embodiments, the electronic apparatus 1000 may be used in a communication interface protocol of a third-generation communication system such as code division multiple access (CDMA), global system for mobile communications (GSM), north American digital cellular (NADC), extended-time division multiple access (E-TDMA), wide band code division multiple access (WCDMA), a 4G (4th Generation) communication system such as 4G LTE, a 5G (5th Generation) communication system, a wired local area network (LAN), a wireless local area network (WLAN), such as Wi-Fi (Wireless Fidelity), a wireless personal area network (WPAN), such as Bluetooth, Wireless USB (Wireless Universal Serial Bus), Zigbee, Near Field Communication (NFC), Radio-frequency identification (RFID), and/or Power Line communication (PLC).

The memory 1030 of the electronic apparatus 1000 may include one or more of the memory devices MC, 10, 10*b*, 10*c*, and 10*d* and/or semiconductor apparatuses 100, 100*a*, and 100*b* according to example embodiments. However, example embodiments are not limited thereto.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that a memory device and a memory apparatus comprising the memory device according to the embodiment described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of inventive concepts as defined by the following claims.

What is claimed is:

1. A memory device comprising:
a first electrode;
a second electrode spaced apart from the first electrode;
an intermediate layer between the first electrode and the second electrode, the intermediate layer having ovonic threshold switching characteristics; and
an interface layer in contact with the intermediate layer, the interface layer having ovonic threshold switching characteristics, wherein
a material of the interface layer has a polarity-induced threshold voltage shift greater than a polarity-induced threshold voltage shift of the intermediate layer.

2. The memory device of claim 1, wherein a threshold voltage change rate of the intermediate layer is less than a threshold voltage change rate of the interface layer.

3. The memory device of claim 1, wherein a threshold voltage change rate of the intermediate layer is 60 mV/dec or less.

4. The memory device of claim 1, wherein the intermediate layer and the interface layer each include a chalcogen compound.

5. The memory device of claim 1, wherein the intermediate layer includes at least one of GeAsSeIn, GeAsSeSIn, GeAsTeSi, and GeAsSeTeSi.

6. The memory device of claim 1, wherein the interface layer includes GeAsSe.

7. The memory device of claim 1, wherein a ratio of germanium (Ge) in the interface layer is greater than a ratio of Ge in the intermediate layer.

8. The memory device of claim 7, wherein the ratio of Ge in the interface layer is 20% or more.

9. The memory device of claim 7, wherein the ratio of Ge in the intermediate layer is less than 20%.

10. The memory device of claim 1, wherein the intermediate layer is doped with a metal.

11. The memory device of claim 10, wherein a doping ratio of the metal is 5% or less.

12. The memory device of claim 10, wherein the metal includes at least one of indium (In), aluminum (Al), silicon (Si), and gallium (Ga).

13. The memory device of claim 1, wherein a metal doping ratio of the interface layer is less than a metal doping ratio of the intermediate layer.

14. The memory device of claim 1, wherein the interface layer is not doped with a metal.

15. The memory device of claim 1, wherein the interface layer is between the first electrode and the intermediate layer.

16. The memory device of claim 1, wherein the interface layer is between the second electrode and the intermediate layer.

17. The memory device of claim 1, wherein the interface layer comprises a first interface layer and a second interface layer, the first interface layer is between the first electrode and the intermediate layer; and the second interface layer is between the second electrode and the intermediate layer.

18. A memory apparatus comprising:

a first electrode line extending in a first direction;

a second electrode line spaced apart from the first electrode line and extending in a second direction crossing the first direction; and a memory device according to claim 1 at an intersection of the first electrode line and the second electrode line.

19. The memory apparatus of claim 18, wherein the first electrode is in contact with the first electrode line, and the second electrode is in contact with the second electrode line.

20. The memory apparatus of claim 18, wherein the first electrode is integrated with the first electrode line, and the second electrode is integrated with the second electrode line.

* * * * *